United States Patent
Shu et al.

(10) Patent No.: US 10,461,178 B2
(45) Date of Patent: Oct. 29, 2019

(54) METHOD FOR MANUFACTURING ARRAY SUBSTRATE, ARRAY SUBSTRATE AND DISPLAY PANEL

(71) Applicant: BOE TECHNOLOGY GROUP CO., LTD., Beijing (CN)

(72) Inventors: Shi Shu, Beijing (CN); Jing Feng, Beijing (CN); Chuanxiang Xu, Beijing (CN); Xiaolong He, Beijing (CN); Jiushi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/329,212

(22) PCT Filed: Jul. 25, 2016

(86) PCT No.: PCT/CN2016/091505
§ 371 (c)(1),
(2) Date: Jan. 25, 2017

(87) PCT Pub. No.: WO2017/117974
PCT Pub. Date: Jul. 13, 2017

(65) Prior Publication Data
US 2018/0308958 A1 Oct. 25, 2018

(30) Foreign Application Priority Data
Jan. 7, 2016 (CN) .......................... 2016 1 0008575

(51) Int. Cl.
*H01L 21/02* (2006.01)
*H01L 29/786* (2006.01)
(Continued)

(52) U.S. Cl.
CPC ...... *H01L 29/66969* (2013.01); *H01L 27/127* (2013.01); *H01L 27/1225* (2013.01);
(Continued)

(58) Field of Classification Search
CPC ... H01L 21/02565; H01L 21/77; H01L 27/12; H01L 27/1225; H01L 27/1262;
(Continued)

(56) References Cited

U.S. PATENT DOCUMENTS

| 2010/0181565 A1 | 7/2010 | Sakata et al. |
| 2011/0233537 A1* | 9/2011 | Shu ............... H01L 29/7869 257/43 |
| 2014/0103334 A1 | 4/2014 | Xie et al. |

FOREIGN PATENT DOCUMENTS

| CN | 101794820 A | 8/2010 |
| CN | 102903674 A | 1/2013 |

(Continued)

OTHER PUBLICATIONS

International Search Report and Written Opinion for Application No. PCT/CN2016/091505, dated Oct. 11, 2016, 10 Pages.
(Continued)

*Primary Examiner* — Long K Tran
(74) *Attorney, Agent, or Firm* — Brooks Kushman P.C.

(57) ABSTRACT

A method for manufacturing an array substrate, an array substrate and a display panel are provided. The method includes forming patterns of a gate metal layer and a gate insulating layer successively on a base plate, forming a pattern of a semiconductor layer, where the pattern of the semiconductor layer comprises a pattern of an active region and a pattern of a pixel electrode region, the semiconductor layer comprises an insulative oxide layer and a semiconductive oxide layer stacked on the insulative oxide layer, and the insulative oxide layer is located between the gate insulating layer and the semiconductive oxide layer, forming a pattern of a source and drain metal layer, and subjecting the semiconductive oxide layer in the pixel electrode region to plasma treatment, to convert the semiconductive oxide layer in the pixel electrode region into a conductor.

20 Claims, 3 Drawing Sheets

(51) Int. Cl.
*H01L 29/66* (2006.01)
*H01L 27/12* (2006.01)

(52) U.S. Cl.
CPC ...... *H01L 27/1262* (2013.01); *H01L 29/7869* (2013.01); *H01L 29/78696* (2013.01); *H01L 21/02488* (2013.01); *H01L 21/02565* (2013.01); *H01L 21/02631* (2013.01)

(58) Field of Classification Search
CPC ............ H01L 27/127; H01L 29/66969; H01L 29/7869; H01L 29/78696
USPC ........................ 257/43; 438/65, 86, 104, 754
See application file for complete search history.

(56) References Cited

FOREIGN PATENT DOCUMENTS

| | | |
|---|---|---|
| CN | 103021939 A | 4/2013 |
| CN | 103928530 A | 7/2014 |
| CN | 105655291 A | 6/2016 |

OTHER PUBLICATIONS

First Office Action for Chinese Application No. 201610008575.7, dated Feb. 13, 2018, 9 Pages.

\* cited by examiner

US 10,461,178 B2

METHOD FOR MANUFACTURING ARRAY SUBSTRATE, ARRAY SUBSTRATE AND DISPLAY PANEL

CROSS-REFERENCE TO RELATED APPLICATION APPLICATIONS

This application is the U.S. national phase of PCT Application No. PCT/CN2016/091505 filed on Jul. 25, 2016, which claims priority to Chinese Patent Application No. 201610008575.7 filed on Jan. 7, 2016, the disclosures of which are incorporated in their entirety by reference herein.

TECHNICAL FIELD

The present disclosure relates to the field of display technology, and in particular, to a method for manufacturing an array substrate, an array substrate and a display panel.

BACKGROUND

A thin film transistor (TFT) in an array substrate may have an active layer made of an oxide semiconductor. The oxide semiconductor has a high mobility and can be used in large size products. However, the oxide semiconductor has some drawbacks such us unstable properties, which usually results in undesirable effects such as threshold voltage (Vth) shift; hence, its application is limited. One reason of the unstable properties of the oxide semiconductor is that, a lattice structure of the oxide semiconductor does not match that of a gate insulating layer in the TFT and lots of defects are generated at the interface therebetween, these defects may capture charges and then cause the undesirable effects.

SUMMARY

In view of the above, the present disclosure provides a method for manufacturing an array substrate, an array substrate and a display panel, to solve the problem that an oxide semiconductor layer does not match a gate insulating layer at a contact interface between the oxide semiconductor layer and the gate insulating layer in an existing array substrate.

The present disclosure provides a method for manufacturing an array substrate, including steps of: forming patterns of a gate metal layer and a gate insulating layer successively on a base plate; forming a pattern of a semiconductor layer, where the pattern of the semiconductor layer includes a pattern of an active region and a pattern of a pixel electrode region, the semiconductor layer includes a first oxide layer and a second oxide layer stacked on the first oxide layer, the first oxide layer is an insulative oxide layer and the second oxide layer is a semiconductive oxide layer, and the first oxide layer is located between the gate insulating layer and the second oxide layer; forming a pattern of a source and drain metal layer; and subjecting the second oxide layer in the pixel electrode region to plasma treatment, to convert the second oxide layer in the pixel electrode region into a conductor.

Optionally, the step of forming the pattern of the semiconductor layer includes: forming a first oxide film using a sputtering process, where a gas used in the sputtering process includes oxygen and argon, and the oxygen is of a first content to enable the first oxide film to be an insulative oxide film; forming a second oxide film using a sputtering process, where a gas used in the sputtering process includes oxygen and argon, and the oxygen is of a second content to enable the second oxide film to be a semiconductive oxide film; and patterning the first oxide film and the second oxide film to form the pattern of the semiconductor layer, where the semiconductor layer includes the first oxide layer formed by the first oxide film and the second oxide layer formed by the second oxide film.

Optionally, the first content ranges from 60 percentages to 90 percentages, and the second content ranges from 30 percentages to 55 percentages.

Optionally, the pattern of the gate metal layer includes a pattern of a gate electrode, the pattern of the source and drain metal layer includes a pattern of a source electrode and a pattern of a drain electrode, and an orthogonal projection of the pattern of the drain electrode onto the base plate is completely located within an orthogonal projection of the pattern of the gate electrode onto the base plate.

Optionally, after the step of forming the pattern of the source and drain metal layer, the method further includes: forming a pattern of a protection layer, where the protection layer is an insulative oxide layer, and the pattern of the protection layer covers the second oxide layer located in a gap region between a source electrode and a drain electrode; and forming a pattern of a passivation layer, where the protection layer is located between the passivation layer and the second oxide layer.

Optionally, the pattern of the source and drain metal layer includes a pattern of the source electrode, a pattern of the drain electrode and a pattern in the pixel electrode region, the pattern of the protection layer further covers the pattern of the source electrode and the pattern of the drain electrode. After the step of forming the pattern of the protection layer and prior to the step of subjecting the second oxide layer in the pixel electrode region to the plasma treatment, the method further includes: etching the source and drain metal layer using the protection layer as a mask, to remove the pattern of the source and drain metal layer in the pixel electrode region.

Optionally, a photoresist on the protection layer is reserved after the pattern of the protection layer is formed. The step of subjecting the second oxide layer in the pixel electrode region to the plasma treatment includes: subjecting the second oxide layer in the pixel electrode region to the plasma treatment using the photoresist as a mask, to convert the semiconductive oxide layer into the conductor, where the plasma treatment is performed using a reducing gas; and removing the photoresist.

Optionally, the pattern of the gate metal layer includes a pattern of a common electrode line. After the step of forming the pattern of the passivation layer, the method further includes: forming a pattern of a common electrode layer, where the common electrode layer is connected to the common electrode line through a via hole penetrating the passivation layer and the gate insulating layer.

Optionally, the insulative oxide layer includes an oxygen-rich oxide layer.

An array substrate is provided in the present disclosure, manufactured by the above mentioned method.

Optionally, the array substrate includes: a base plate; a pattern of a gate metal layer, including a pattern of a gate electrode; a pattern of a gate insulating layer; a pattern of an active region and a pattern of a pixel electrode region arranged at an identical layer, where the pattern of the active region includes a first oxide layer and a second oxide layer stacked on the first oxide layer, and the first oxide layer is located between the gate insulating layer and the second oxide layer, the pattern of the pixel electrode region includes the first oxide layer and a conductive layer stacked on the first oxide layer, and the first oxide layer is an insulative oxide layer and the second oxide layer is a semiconductive oxide layer; and a pattern of a source electrode and a pattern of a drain electrode, where an orthogonal projection of the pattern of the drain electrode onto the base plate is completely located within an orthogonal projection of the pattern of the gate electrode onto the base plate.

Optionally, the array substrate further includes: pattern of a protection layer, where the protection layer is an insulative oxide layer and the pattern of the protection layer covers the second oxide layer located in a gap region between the source electrode and the drain electrode; and a pattern of a passivation layer.

Optionally, the pattern of the protection layer is located between the pattern of the passivation layer and the second oxide layer.

The present disclosure further provides a display panel including the above described array substrate.

The technical solutions of the present disclosure may have the following beneficial effects. The insulative oxide layer is arranged between the semiconductive oxide layer and the gate insulating layer, and the lattice structure of the insulative oxide layer matches with that of the semiconductive oxide layer well; hence, interface defects of the thin film transistor is alleviated and undesirable effects due to the interface defects are avoided. In addition, the active layer and the pixel electrode can be formed by a single patterning process, which reduces manufacture cost of the array substrate.

DETAILED DESCRIPTION OF THE EMBODIMENTS

Figure 1:
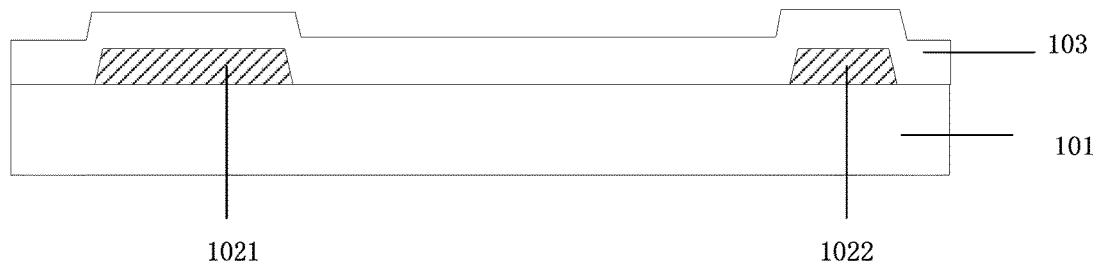
FIG. 1-FIG. 8 illustrate a procedure for manufacturing an array substrate according to some embodiments of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

In order to solve the problem that an oxide semiconductor layer does not match a gate insulating layer at a contact interface between the oxide semiconductor layer and the gate insulating layer in an array substrate, the present disclosure provides a method for manufacturing an array substrate in some embodiments, which includes the following steps S11-S14.

In step S11, patterns of a gate metal layer and a gate insulating layer are successively formed on a base plate.

The pattern of the gate metal layer at least includes a pattern of a gate electrode, and may optionally include a pattern of a gate line. In some embodiments, the pattern of the gate metal layer may further include a pattern of a common electrode line. The gate metal layer may be made of an insulative material such as $SiO_2$.

In step S12, a pattern of a semiconductor layer is formed. The pattern of the semiconductor layer includes a pattern of an active region and a pattern of a pixel electrode region. The semiconductor layer includes a first oxide layer and a second oxide layer stacked on the first oxide layer, the first oxide layer is an insulative oxide layer and the second oxide layer is a semiconductive oxide layer, and the first oxide layer is located between the gate insulating layer and the second oxide layer.

In the embodiments, the insulative oxide is formed by increasing the content of oxygen in a process of forming an oxide semiconductor through sputtering, which is also called as an oxygen-rich oxide. The oxygen-rich oxide has a relatively small number of oxygen vacancies and is therefore insulative. A lattice structure of the oxygen-rich oxide matches that of a normal semiconductive oxide well; hence, interface defects of a thin film transistor can be alleviated and undesirable effects due to the interface defects can be avoided.

In step S13, a pattern of a source and drain metal layer is formed.

The pattern of the source and drain metal layer at least includes a pattern of a source electrode and a pattern of a drain electrode, and may optionally include a pattern of a data line.

In step S14, the second oxide layer in the pixel electrode region is subjected to a plasma treatment, to convert the second oxide layer in the pixel electrode region into a conductor. After the second oxide layer in the pixel electrode region has been converted into the conductor, it serves as a pixel electrode.

To make the pixel region transparent, the insulative oxide and the semiconductive oxide are both transparent oxides, and are optionally made of IGZO or the like.

In the embodiments of the present disclosure, the insulative oxide layer is arranged between the semiconductive oxide layer and the gate insulating layer, and the lattice structure of the insulative oxide layer matches with that of the semiconductive oxide layer well; hence, the interface defects of the thin film transistor are alleviated and undesirable effects due to the interface defects are avoided. In addition, the active layer and the pixel electrode can be formed by a single patterning process, which reduces the quantity of mask and manufacture cost of the array substrate.

How to form the pattern of the semiconductor layer is detailed hereinafter.

According to an embodiment of the present disclosure, the step of forming the pattern of the semiconductor layer includes the following steps S121-S123.

In step S121, a first oxide film is formed using a sputtering process. A gas used in the sputtering process includes oxygen and argon, and the oxygen is of a first content to enable the first oxide film to be an insulative oxide film (i.e., an oxygen-rich oxide layer).

In step S122, a second oxide film is formed using a sputtering process. A gas used in the sputtering process includes oxygen and argon, and the oxygen is of a second content to enable the second oxide film to be a semiconductive oxide film.

In step S123, the first oxide film and the second oxide film are patterned to form the pattern of the semiconductor layer. The semiconductor layer includes the first oxide layer formed by the first oxide film and the second oxide layer formed by the second oxide film.

Optionally, the first content ranges from 60 percentages to 90 percentages, and the second content ranges from 30 percentages to 55 percentages.

According to an embodiment of the present disclosure, each of the insulative oxide film and the semiconductive oxide film is formed using a magnetron sputtering process. Relative parameters of the magnetron sputtering process for forming the insulative oxide film are described as follows: the power ranges from 2000 W to 6000 W, the temperature ranges from 20 Celsius degrees to 50 Celsius degrees, the oxygen content (the first content) ranges from 60 percentages to 90 percentages, and the argon content ranges from 10 percentages to 40 percentages. Relative parameters of the magnetron sputtering process for forming the semiconductive oxide film are described as follows: the power ranges from 2000 W to 6000 W, the temperature ranges from 20 Celsius degrees to 50 Celsius degrees, the oxygen content (the second content) ranges from 30 percentages to 55 percentages, and the argon content ranges from 45 percentages to 70 percentages.

In some embodiments of the present disclosure, a passivation layer is to be formed after the source and drain metal layer is formed. A lattice structure of the passivation layer does not match that of the semiconductive oxide layer, if the passivation layer directly contacts the semiconductive oxide layer in a gap region between the source electrode and the drain electrode (the gap region is referred to as a channel region), defects may be generated at an interface between the semiconductive oxide layer and the passivation layer and such defects may capture charges, thereby resulting in undesirable effects.

In view of the above problem, in some embodiments of the present disclosure, the method further includes step S15 and step S16 after the step of forming the pattern of the source and drain metal layer.

In step S15, a pattern of a protection layer is formed. The protection layer is an insulative oxide layer. The pattern of the protection layer covers the second oxide layer located in the gap region (the channel region) between the source electrode and the drain electrode. Here, the insulative oxide is also formed by increasing the content of oxygen in a process of forming an oxide semiconductor through sputtering, which is also called as an oxygen-rich oxide.

In step S16, a pattern of a passivation layer is formed. The protection layer is located between the passivation layer and the second oxide layer, such that the second oxide layer (the semiconductive oxide layer) in the channel region directly contacts the protection layer (insulative oxide layer) while does not contact the passivation layer. The lattice structure of the semiconductive oxide layer matches that of the insulative oxide layer well; hence, interface defects of a thin film transistor can be alleviated and undesirable effects due to the interface defects can be avoided.

In the step of forming the pattern of the protection layer, a patterning process (including exposing, developing, etching and so on) is required. To protect the second oxide layer (the semiconductive oxide layer) in the pixel electrode region from being adversely affected by an etchant used in the etching process, a pattern of the source and drain metal layer is further formed in the pixel electrode region. That is, in addition to the pattern of the source electrode and the pattern of the drain electrode, the pattern of the source and drain metal layer further includes a pattern of the pixel electrode region. Hence, when forming the pattern of the protection layer, the semiconductive oxide layer in the pixel electrode region is protected from being adversely affected by the etching process since the pixel electrode region is completely covered by the pattern of the source and drain metal layer.

Obviously, after the pattern of the protection layer is formed, the pattern of the source and drain metal layer in the pixel electrode region needs to be etched off and the semiconductive oxide layer in the pixel electrode region is to be subjected to a plasma treatment. When etching the pattern of the source and drain metal layer in the pixel electrode region, patterns of the source and drain metal layer in the source electrode region and the drain electrode region need to be protected from being etched. Optionally, the pattern of the protection layer further covers the patterns of the source electrode and the drain electrode. After the step of forming the pattern of the protection layer and prior to the step of subjecting the second oxide layer in the pixel electrode region to the plasma treatment, the method further includes: etching the source and drain metal layer using the protection layer as a mask, to remove the pattern of the source and drain metal layer in the pixel electrode region.

When subjecting the second oxide layer in the pixel electrode region to the plasma treatment, a reducing gas such as hydrogen can be used to perform the plasma treatment. Optionally, according to some embodiments of the present disclosure, in order to prevent a reaction between the reducing gas and oxygen in the protection layer (the oxygen-rich oxide layer), a photoresist on the pattern of the protection layer is reserved after the pattern of the protection layer is formed. The step of subjecting the second oxide layer in the pixel electrode region to the plasma treatment specifically includes: subjecting the second oxide layer in the pixel electrode region to the plasma treatment using the photoresist as a mask, to convert the semiconductive oxide layer into the conductor to serve as the pixel electrode, where the plasma treatment is performed using a reducing gas; and removing the photoresist.

In the embodiments, in order to charge the pixel electrode (the conductor in the pixel electrode region), optionally, an orthogonal projection of the pattern of the drain electrode onto the base plate is completely located within an orthogonal projection of the pattern of the gate electrode onto the base plate. In this way, a boundary between a conductive part and a nonconductive part of the second oxide layer is located above the pattern of the gate electrode, such that electricity can be conducted from the data line to the pixel electrode in the case that the thin film transistor is turned on.

According to some other embodiments of the present disclosure, it is not necessary that the orthogonal projection of the pattern of the drain electrode onto the base plate is completely located within the orthogonal projection of the pattern of the gate electrode onto the base plate, as long as it is ensured that the boundary between the conductive part and the nonconductive part of the second oxide layer is located above the pattern of the gate electrode.

In the above embodiments, the pattern of the gate metal layer may further include a pattern of a common electrode line. After the step of forming the pattern of the passivation layer, the method further includes: forming a pattern of a common electrode layer, where the common electrode layer is connected to the common electrode line through a via hole penetrating the passivation layer and the gate insulating layer.

In the above embodiments, the gate metal layer and the source and drain metal layer can be made of a metallic material having a small resistivity, such as, Cu, thereby improving conducting performance.

An array substrate is further provided according to some embodiments of the present disclosure. The array substrate is manufactured by the method according to any of the foregoing embodiments.

According to an embodiment of the present disclosure, the array substrate includes: a base plate; a pattern of a gate metal layer, including a pattern of a gate electrode; a pattern of a gate insulating layer; a pattern of an active region and a pattern of a pixel electrode region arranged at an identical layer, where the pattern of the active region includes a first oxide layer and a second oxide layer stacked on the first oxide layer, and the first oxide layer is located between the gate insulating layer and the second oxide layer, the pattern of the pixel electrode region includes the first oxide layer and a conductive layer stacked on the first oxide layer, and the first oxide layer is an insulative oxide layer and the second oxide layer is a semiconductive oxide layer; and a pattern of a source electrode and a pattern of a drain electrode, where an orthogonal projection of the pattern of the drain electrode onto the base plate is completely located within an orthogonal projection of the pattern of the gate electrode onto the base plate.

The insulative oxide layer is arranged between the semiconductive oxide layer and the gate insulating layer, and the lattice structure of the insulative oxide layer matches with that of the semiconductive oxide layer well; hence, the interface defects of the thin film transistor are alleviated and undesirable effects due to the interface defects are avoided. In addition, the active layer and the pixel electrode can be formed by a single patterning process, which reduces manufacture cost of the array substrate.

Optionally, the array substrate further includes: a pattern of a protection layer, where the protection layer is an insulative oxide layer and the pattern of the protection layer covers the second oxide layer located in a gap region between the source electrode and the drain electrode; and a pattern of a passivation layer.

The protection layer is located between the passivation layer and the second oxide layer, such that the second oxide layer (the semiconductive oxide layer) directly contacts the protection layer (insulative oxide layer) while does not contact the passivation layer. The lattice structure of the semiconductive oxide layer matches that of the insulative oxide layer well; hence, interface defects of a thin film transistor can be alleviated and undesirable effects due to the interface defects can be avoided.

The present disclosure further provides a display panel, including the array substrate according to any of the foregoing embodiments.

The present disclosure further provides a display device, including the above mentioned display panel.

An implementation of the present disclosure is detailed hereinafter in conjunction with drawings and embodiments. The following embodiment is to explain the disclosure, rather than to limit the disclosure.

References can be made to FIGS. 1-8, which illustrate a procedure of manufacturing an array substrate according to an embodiment of the present disclosure. The method includes the followings steps S21-S28.

In step S21, as shown in FIG. 1, a base plate 101 is provided, and patterns of a gate metal layer and a gate insulating layer 103 are successively formed on the base plate. The pattern of the gate metal layer includes a pattern of a gate electrode 1021, a pattern of a gate line (not shown) and a pattern of a common electrode line 1022.

Figure 2:
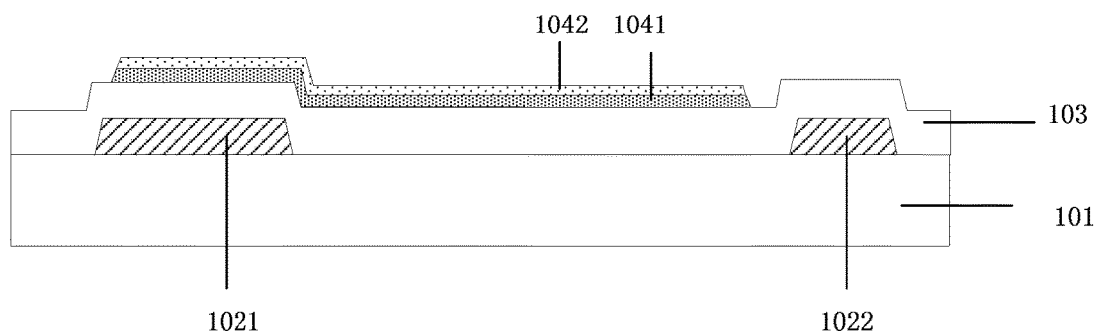

In step S22, as shown in FIG. 2, a pattern of a semiconductor layer is formed on the gate insulating layer 103. The pattern of the semiconductor layer includes a pattern of an active region and a pattern of a pixel electrode region. The semiconductor layer includes a first oxide layer 1041 and a second oxide layer 1042 stacked on the first oxide layer 1041, the first oxide layer 1041 is an insulative oxide layer and the second oxide layer 1042 is a semiconductive oxide layer, and the first oxide layer 1041 is located between the gate insulating layer and the second oxide layer 1042.

Figure 3:
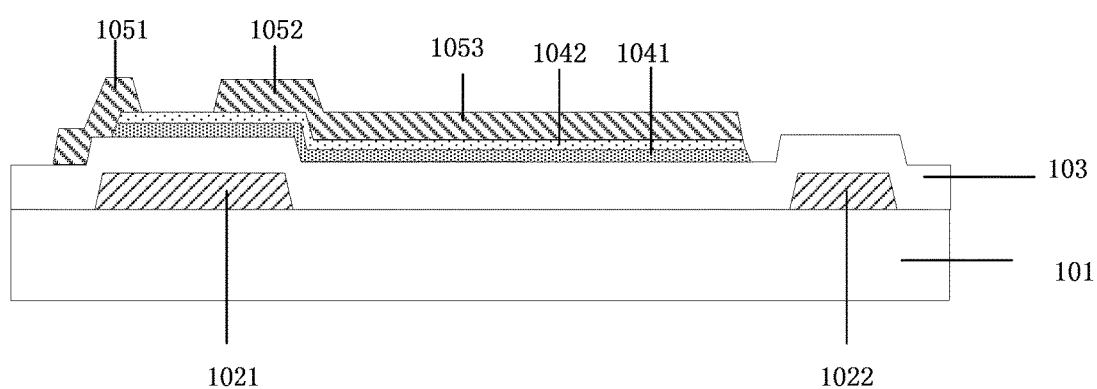

In step S23, as shown in FIG. 3, a pattern of a source and drain metal layer is formed. The pattern of the source and drain metal layer includes a pattern of a source electrode 1051, a pattern of a drain electrode 1052, a pattern of a data line (not shown) and a pattern 1053 of the source and drain metal layer in the pixel electrode region. The pattern 1053 of the source and drain metal layer in the pixel electrode region covers the pixel electrode region. An orthogonal projection of the pattern of the drain electrode 1052 onto the base plate 101 is completely located within an orthogonal projection of the pattern of the gate electrode 1021 onto the base plate 101.

Figure 4:
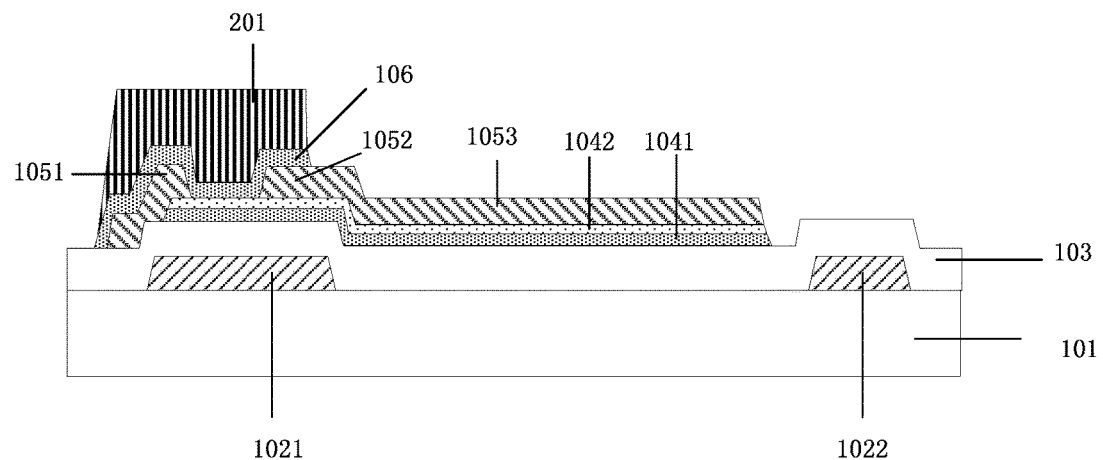

In step S24, as shown in FIG. 4, a pattern of a protection layer 106 is formed and a photoresist 201 on the pattern of the protection layer 106 is reserved. The protection layer 106 is an insulative oxide layer, and the pattern of the protection layer 106 covers the source electrode 1051, the drain electrode 1052 and the second oxide layer located in a gap region (channel region) between the source electrode 1051 and the drain electrode 1052.

Figure 5:
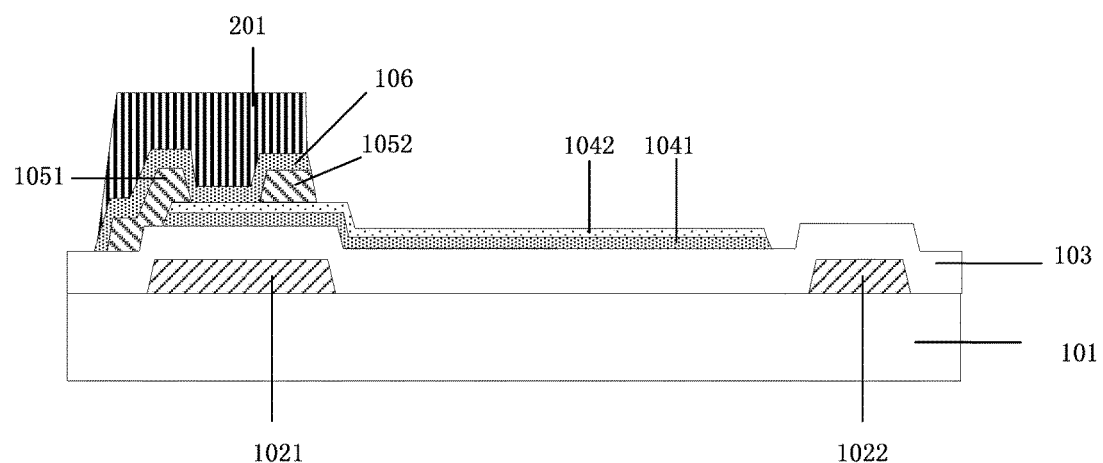

In step S25, as shown in FIG. 5, the source and drain metal layer is etched using the protection layer 106 as a mask, to remove the pattern 1053 of the source and drain metal layer in the pixel electrode region.

Figure 6:
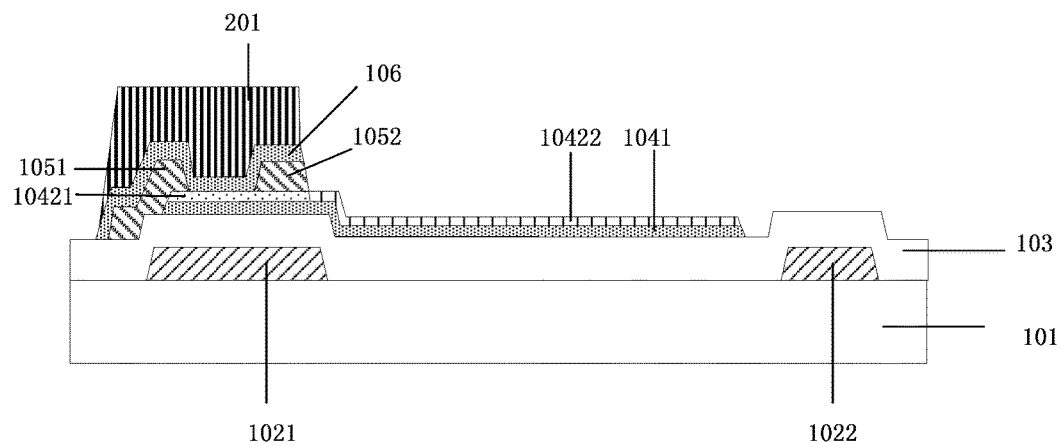

In step S26, as shown in FIG. 6, the second oxide layer (the semiconductive oxide layer) in the pixel electrode region is subjected to a plasma treatment using the photoresist 201 as a mask, to convert the semiconductive oxide layer in the pixel electrode region into a conductor, to form a pattern of an active layer 10421 and a pattern of a pixel electrode 10422. In step S26, hydrogen may be used to perform the plasma treatment. Then, the photoresist 201 is removed.

Figure 7:
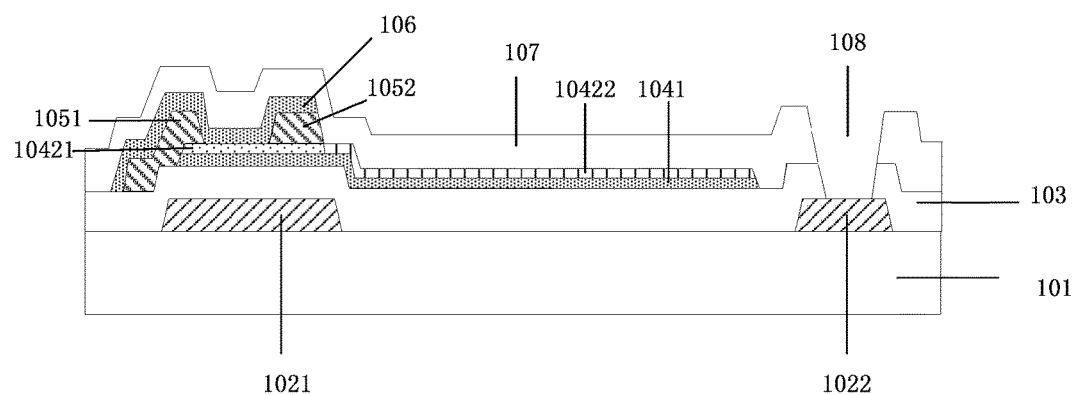

In step S27, as shown in FIG. 7, a pattern 107 of a passivation layer is formed, and a via hole 108 penetrating the passivation layer and the gate insulating layer is formed in the passivation layer.

Figure 8:
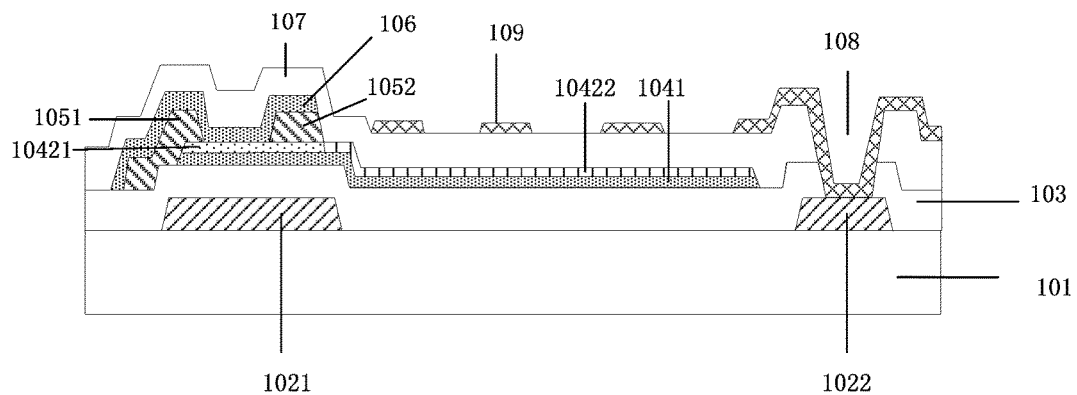

In step S28, as shown in FIG. 8, a pattern 109 of a common electrode layer is formed. The common electrode layer is connected to the common electrode line 1022 through the via hole 108 penetrating the passivation layer and the gate insulating layer.

In the embodiments of the present disclosure, the insulative oxide layer is arranged between the semiconductive oxide layer and the gate insulating layer, and the lattice structure of the insulative oxide layer matches with that of the semiconductive oxide layer well; hence, interface defects of the thin film transistor is alleviated and undesirable effects due to the interface defects are avoided. The insulative oxide layer (the protection layer) is located between the passivation layer and the semiconductive oxide layer, such that the semiconductive oxide layer directly contacts the insulative oxide layer (the protection layer) while does not contact the passivation layer. The lattice structure of the semiconductive oxide layer matches that of the insulative oxide layer well; hence, interface defects of the thin film transistor can be alleviated and undesirable effects due to the interface defects can be avoided. In addition, the active layer and the pixel electrode can be formed by a single patterning process, which reduces manufacture cost of the array substrate.

The disclosed embodiments are preferred embodiments of the present disclosure. It should be noted that, the ordinary skilled in the art can make various modifications and polishment without departing from the principle and scope of the present disclosure, and all those modifications and polishment fall within protection scope of the present disclosure.

What is claimed is:

1. A method for manufacturing an array substrate, comprising steps of:
    forming patterns of a gate metal layer and a gate insulating layer successively on a base plate;
    forming a pattern of a semiconductor layer, wherein the semiconductor layer comprises a first oxide layer and a second oxide layer stacked on the first oxide layer, the first oxide layer is an insulative oxide layer and the second oxide layer is a semiconductive oxide layer, and the first oxide layer is located between the gate insulating layer and the second oxide layer;
    forming a pattern of a source and drain metal layer; and
    the first oxide layer including a first active region and a first pixel electrode region, the second oxide layer including a second active region and a second pixel electrode region, subjecting the second pixel electrode region of the second oxide layer to plasma treatment, to convert the second pixel electrode region of the second oxide layer into a conductor to form a pixel electrode.

2. The method for manufacturing the array substrate according to claim 1, wherein the step of forming the pattern of the semiconductor layer comprises:
    forming a first oxide film using a sputtering process, wherein a gas used in the sputtering process comprises oxygen and argon, and the oxygen is of a first content to enable the first oxide film to be an insulative oxide film;
    forming a second oxide film using a sputtering process, wherein a gas used in the sputtering process comprises oxygen and argon, and the oxygen is of a second content to enable the second oxide film to be a semiconductive oxide film; and
    patterning the first oxide film and the second oxide film to form the pattern of the semiconductor layer, wherein the semiconductor layer comprises the first oxide layer formed by the first oxide film and the second oxide layer formed by the second oxide film.

3. The method for manufacturing the array substrate according to claim 2, wherein the first content ranges from 60 percentages to 90 percentages, and the second content ranges from 30 percentages to 55 percentages.

4. The method for manufacturing the array substrate according to claim 3, wherein the insulative oxide layer comprises an oxygen-rich oxide layer.

5. The method for manufacturing the array substrate according to claim 2, wherein the insulative oxide layer comprises an oxygen-rich oxide layer.

6. The method for manufacturing the array substrate according to claim 1, wherein the pattern of the gate metal layer comprises a pattern of a gate electrode, the pattern of the source and drain metal layer comprises a pattern of a source electrode and a pattern of a drain electrode, and an orthogonal projection of the pattern of the drain electrode onto the base plate is completely covered by an orthogonal projection of the pattern of the gate electrode onto the base plate.

7. The method for manufacturing the array substrate according to claim 4, wherein the insulative oxide layer comprises an oxygen-rich oxide layer.

8. The method for manufacturing the array substrate according to claim 1, wherein after the step of forming the pattern of the source and drain metal layer, the method further comprises:
    forming a pattern of a protection layer, wherein the protection layer is an insulative oxide layer, and the pattern of the protection layer covers the second oxide layer located in a gap region between a source electrode and a drain electrode; and
    forming a pattern of a passivation layer, wherein the protection layer is located between the passivation layer and the second oxide layer.

9. The method for manufacturing the array substrate according to claim 8, wherein the pattern of the source and drain metal layer comprises a pattern of the source electrode, a pattern of the drain electrode and a pattern in the pixel electrode region, the pattern of the protection layer further covers the pattern of the source electrode and the pattern of the drain electrode; and
    after the step of forming the pattern of the protection layer and prior to the step of subjecting the second oxide layer in the pixel electrode region to the plasma treatment, the method further comprises:
    etching the source and drain metal layer using the protection layer as a mask, to remove the pattern of the source and drain metal layer in the pixel electrode region.

10. The method for manufacturing the array substrate according to claim 8, wherein the insulative oxide layer comprises an oxygen-rich oxide layer.

11. The method for manufacturing the array substrate according to claim 8, wherein a photoresist on the protection layer is reserved after the pattern of the protection layer is formed; and
    wherein the step of subjecting the second oxide layer in the pixel electrode region to the plasma treatment comprises:
    subjecting the second oxide layer in the pixel electrode region to the plasma treatment using the photoresist as a mask, to convert the semiconductive oxide layer into the conductor, wherein the plasma treatment is performed using a reducing gas; and
    removing the photoresist.

12. The method for manufacturing the array substrate according to claim 8, wherein the pattern of the gate metal layer comprises a pattern of a common electrode line; and
    after the step of forming the pattern of the passivation layer, the method further comprises:
    forming a pattern of a common electrode layer, wherein the common electrode layer is connected to the common electrode line through a via hole penetrating the passivation layer and the gate insulating layer.

13. The method for manufacturing the array substrate according to claim 1, wherein the insulative oxide layer comprises an oxygen-rich oxide layer.

14. An array substrate, comprising:
a base plate;
a pattern of a gate metal layer, comprising a pattern of a gate electrode;
a pattern of a gate insulating layer;
a pattern of a semiconductor layer, wherein the semiconductor layer comprises a first oxide layer and a second oxide layer stacked on the first oxide layer, the first oxide layer is an insulative oxide layer and the second oxide layer is a semiconductive oxide layer, and the first oxide layer is located between the gate insulating layer and the second oxide layer; and
a pattern of a source and drain metal layer, comprising a pattern of a drain electrode and a pattern of a source electrode;
wherein the first oxide layer includes a first active region and a first pixel electrode region, the second oxide layer includes a second active region and a second pixel electrode region, the second pixel electrode region of the second oxide layer comprising a pixel electrode formed by converting the second pixel electrode region of the second oxide layer into a conductor.

15. The array substrate according to claim 14, further comprising:
a pattern of a protection layer, wherein the protection layer is an insulative oxide layer and the pattern of the protection layer covers the second oxide layer located in a gap region between the source electrode and the drain electrode; and
a pattern of a passivation layer.

16. The array substrate according to claim 15, wherein the pattern of the protection layer is located between the pattern of the passivation layer and the second oxide layer.

17. A display panel, comprising the array substrate according to claim 14.

18. The array substrate according to claim 14, wherein an orthogonal projection of the pattern of the drain electrode onto the base plate is completely covered by an orthogonal projection of the pattern of the gate electrode onto the base plate.

19. The array substrate according to claim 14, wherein the second active region and the second pixel electrode region are made of a same material with different oxygen content.

20. A method for manufacturing an array substrate, comprising steps of:
forming patterns of a gate metal layer and a gate insulating layer successively on a base plate;
forming a pattern of a semiconductor layer, wherein the pattern of the semiconductor layer comprises a pattern of an active region and a pattern of a pixel electrode region, the semiconductor layer comprises a first oxide layer and a second oxide layer stacked on the first oxide layer, the first oxide layer is an insulative oxide layer and the second oxide layer is a semiconductive oxide layer, and the first oxide layer is located between the gate insulating layer and the second oxide layer;
forming a pattern of a source and drain metal layer;
forming a pattern of a protection layer, wherein the protection layer is an insulative oxide layer, and the pattern of the protection layer completely covers a source electrode, a drain electrode and the second oxide layer located in a gap region between the source electrode and the drain electrode;
forming a pattern of a passivation layer, wherein the protection layer is located between the passivation layer and the second oxide layer; and
subjecting the second oxide layer in the pixel electrode region to plasma treatment, to convert the second oxide layer in the pixel electrode region into a conductor.

* * * * *